United States Patent
Park et al.

(10) Patent No.: US 9,525,086 B2
(45) Date of Patent: Dec. 20, 2016

(54) METHOD OF PREPARING METAL NANOPARTICLES FOR SOLAR CELL, INK COMPOSITION INCLUDING THE METAL NANOPARTICLES, AND METHOD OF PREPARING THIN FILM USING THE SAME

(71) Applicant: LG CHEM, LTD., Seoul (KR)

(72) Inventors: Eunju Park, Daejeon (KR); Seokhee Yoon, Daejeon (KR); Seokhyun Yoon, Daejeon (KR); Taehun Yoon, Daejeon (KR); Hosub Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/432,989

(22) PCT Filed: Jan. 22, 2014

(86) PCT No.: PCT/KR2014/000618
§ 371 (c)(1),
(2) Date: Apr. 1, 2015

(87) PCT Pub. No.: WO2014/119868
PCT Pub. Date: Aug. 7, 2014

(65) Prior Publication Data
US 2015/0325724 A1    Nov. 12, 2015

(30) Foreign Application Priority Data

Jan. 29, 2013    (KR) .................. 10-2013-0009730

(51) Int. Cl.
*H01L 21/00* (2006.01)
*H01L 31/032* (2006.01)
(Continued)

(52) U.S. Cl.
CPC ......... *H01L 31/0326* (2013.01); *B22F 1/0018* (2013.01); *B22F 9/24* (2013.01);
(Continued)

(58) Field of Classification Search
CPC .......... B22F 1/0018; B22F 9/24; C09D 11/00; H01L 31/0326; H01L 31/1868; H01L 31/18
See application file for complete search history.

(56) References Cited

U.S. PATENT DOCUMENTS

2012/0061628 A1    3/2012    Johnson et al.

FOREIGN PATENT DOCUMENTS

| CN | 1459348 A | 12/2003 |
|---|---|---|
| JP | 2004-263222 A | 9/2004 |

(Continued)

*Primary Examiner* — Richard Booth
(74) *Attorney, Agent, or Firm* — Dentons US LLP

(57) ABSTRACT

Disclosed are a method of preparing metal nanoparticles for solar cells, an ink composition including the metal nanoparticles, and a method of preparing a thin film using the same. More particularly, there are provided a method of preparing metal nanoparticles for forming a light absorption layer of a solar cell, including preparing a first solution including a reducing agent, preparing a second solution including at least two salts selected from the group consisting of a copper (Cu) salt, a zinc (Zn) salt, and a tin (Sn) salt, preparing a mixture by mixing the first solution and the second solution, and synthesizing at least one kind of metal nanoparticles by reaction of the mixture and purifying the synthesized metal nanoparticles, an ink composition including the metal nanoparticles, and a method of preparing a thin film using the same.

29 Claims, 12 Drawing Sheets

(51) Int. Cl.
*C08K 3/08* (2006.01)
*C09D 11/00* (2014.01)
*H01L 31/18* (2006.01)
*B22F 9/24* (2006.01)
*B22F 1/00* (2006.01)

(52) U.S. Cl.
CPC ............... *C08K 3/08* (2013.01); *C09D 11/00* (2013.01); *H01L 31/18* (2013.01); *H01L 31/1868* (2013.01); *C08K 2003/085* (2013.01); *C08K 2003/0893* (2013.01); *Y02E 10/50* (2013.01)

(56) References Cited

FOREIGN PATENT DOCUMENTS

| | | |
|---|---|---|
| KR | 10-2011-0075227 A | 7/2011 |
| KR | 10-2011-0112977 A | 10/2011 |
| KR | 10-2012-0028933 A | 3/2012 |
| TW | I314475 B | 9/2009 |
| WO | 2007/134843 A2 | 11/2007 |
| WO | 2012-071287 A1 | 5/2012 |
| WO | 2012071287 A1 | 5/2012 |
| WO | 2012-174235 A1 | 12/2012 |

METHOD OF PREPARING METAL NANOPARTICLES FOR SOLAR CELL, INK COMPOSITION INCLUDING THE METAL NANOPARTICLES, AND METHOD OF PREPARING THIN FILM USING THE SAME

This application is a National Stage Entry of International Application No. PCT/KR2014/000618, filed Jan. 22, 2014, and claims the benefit of Korean Application No. 10-2013-0009730 filed on Jan. 29, 2013, all of which are hereby incorporated by reference in their entirety for all purposes as if fully set forth herein.

TECHNICAL FIELD

The present invention relates to a method of preparing metal nanoparticles for solar cells, an ink composition including the metal nanoparticles, and a method of preparing a thin film using the same. More particularly, the present invention relates to a method of preparing metal nanoparticles for forming a light absorption layer of a solar cell, including preparing a first solution including a reducing agent, preparing a second solution including at least two salts selected from the group consisting of a copper (Cu) salt, a zinc (Zn) salt, and a tin (Sn) salt, preparing a mixture through mixing of the first and second solutions, and synthesizing nanoparticles of at least one metal by reaction of the mixture and purifying the synthesized nanoparticles, an ink composition including the metal nanoparticles, and a method of preparing a thin film using the same.

BACKGROUND ART

Solar cells have been manufactured using a light absorption layer formed at high cost and silicon (Si) as a semiconductor material since an early stage of development. To more economically manufacture commercially available solar cells, products as structures of thin film solar cells, using an inexpensive light absorbing material such as copper-indium-gallium-sulfo-di-selenide (CIGS) or Cu(In, Ga)(S, Se)$_2$, have been developed. Such CIGS-based solar cells typically include a rear electrode layer, an n-type junction part, and a p-type light absorption layer. Solar cells including such CIGS layers have a power conversion efficiency of greater than 19%. However, in spite of potential for CIGS-based thin film solar cells, costs and insufficient supply of In are main obstacles to widespread application and commercial applicability of thin film solar cells using CIGS-based light absorption layers.

Thus, as an alternative to the CIGS-based light absorption layer, CZTS(Cu$_2$ZnSn(S,Se)$_4$)-based solar cells including copper (Cu), zinc (Zn), tin (Sn), sulfur (S), or selenium (Se) have recently received attention. CZTS has a direct band gap of about 1.0 eV to about 1.5 eV and an absorption coefficient of $10^4$ cm$^{-1}$ or more, reserves thereof are relatively high, and CZTS uses Sn and Zn, which are inexpensive.

In 1996, CZTS hetero-junction PV batteries were reported for the first time, but CZTS-based solar cells have been less advanced than CIGS-based solar cells and photoelectric efficiency of CZTS-based solar cells is much lower than that of CIGS-based solar cells. Thin films of CZTS are manufactured by sputtering, hybrid sputtering, pulsed laser deposition, spray pyrolysis, electro-deposition/thermal sulfurization, e-beam processing, Cu/Zn/Sn/thermal sulfurization, and a sol-gel method.

With regard to fabrication methods, WO2007-134843 discloses a method of forming a CZTS layer by simultaneously or sequentially stacking Cu, Zn, and Sn via vacuum sputtering and heat-treating the resulting material under an S or Se atmosphere. Some papers ((Phys, Stat. Sol. C. 2006, 3, 2844./Prog. Photovolt: Res. Appl. 2011; 19:93-96) disclose a method of forming a CZTS layer by simultaneously depositing Cu, Zn, Sn, S, or Se on a base by simultaneous vacuum evaporation. However, the above-described related art is advantageous in that deposition is performed in a relatively well-controlled state, but is disadvantageous in that manufacturing costs are high due to use of expensive equipment.

In addition, US2011-0097496 discloses a method of forming a CZTS layer using a precursor for forming the CZTS layer, prepared by dissolving Cu, Zn, Sn salts together with an excess of S or Se in hydrazine, through heat treatment and selenization in subsequent processes. However, hydrazine including a chalcogen compound containing an excess of S or Se is a highly toxic, highly reactive, highly explosive solvent and thus a solution process using hydrazine has a potential of high risk. In addition, hydrazine is difficult to handle and thus there are difficulties in manufacturing processes.

Journal, J. Am. Chem. Soc., 2009, 131, 11672 discloses that CZTS nanoparticles are formed by mixing a solution including Cu, Sn and Zn precursors and a solution including S or Se at high temperature through hot injection. PCT/US/2010-035792 discloses formation of a thin film through heat treatment of an ink including CZTS/Se precursor particles on a base. However, when nanoparticles of a metal element and a Group XVI element are formed, it is difficult to form a light absorption layer with much higher density.

Therefore, there is a high need to develop a technology for thin film solar cells including high efficiency light absorption layers formed using a fabrication method that is less expensive and safer than an existing CZTS preparation method.

DISCLOSURE

Technical Problem

Therefore, the present invention has been made to solve the above problems and other technical problems that have yet to be resolved.

As a result of a variety of intensive studies and various experiments, the inventors of the present invention developed a method of preparing nanoparticles of Cu, Zn, and/or Sn through a specific solution process and confirmed that, when a thin film is formed by coating the metal nanoparticles on a base provided with an electrode, followed by heat treatment and selenization, inexpensive and safe manufacturing processes are possible and a light absorption layer for CZTS-based solar cells that has high density is grown through selenization and, accordingly, photoelectric efficiency may be enhanced, thus completing the present invention.

Technical Solution

In accordance with one aspect of the present invention, provided is a method of preparing metal nanoparticles for forming a light absorption layer of a solar cell, including:

preparing a first solution including a reducing agent;

preparing a second solution including at least two salts selected from the group consisting of a copper (Cu) salt, a zinc (Zn) salt, and a tin (Sn) salt;

preparing a mixture by mixing the first and second solutions; and synthesizing at least one kind of metal nanoparticles by reaction of the mixture and purifying the synthesized metal nanoparticles.

The method of preparing metal nanoparticles is performed through a solution process instead of being performing through an existing vacuum process and thus manufacturing costs may be reduced. In addition, the method does not use toxic hydrazine as a solvent for preparing a solution and thus dangers that may occur in an existing solution process may be prevented.

In a specific embodiment, solvents for the first and second solutions may be selected from the group consisting of water, diethylene glycol (DEG), methanol, oleylamine, ethylene glycol, triethylene glycol, dimethyl sulfoxide, dimethyl formamide, and N-methyl-2-pyrrolidone (NMP).

The reducing agent included in the first solution may be an organic reducing agent and/or an inorganic reducing agent, instead of being toxic hydrazine. In particular, the reducing agent may be one selected from the group consisting of $LiBH_4$, $NaBH_4$, $KBH_4$, $Ca(BH_4)_2$, $Mg(BH_4)_2$, $LiB(Et)_3H$, $NaBH_3(CN)$, $NaBH(OAc)_3$, ascorbic acid, and triethanolamine.

In a specific embodiment, the Cu, Zn and Sn salts included in the second solution may be at least one salt selected from the group consisting of a chloride, a bromide, an iodide, a nitrate, a nitrite, a sulfate, an acetate, a sulfite, an acetylacetonate, and a hydroxide. As the Sn salt, a divalent or tetravalent salt may be used, but embodiments of the present invention are not limited thereto.

As can be confirmed from examples described below, kinds of the salts included in the second solution may be determined according to kinds of finally desired metal nanoparticles.

When the mixture is prepared by mixing the first solution with the second solution, a mix ratio of a total of the salts to the reducing agent may, for example, be 1:1 to 1:20 on a molar ratio basis.

When the amount of the reducing agent in the salts is too small, reduction of the metal salts insufficiently occurs and thus an excessively small size or small amount of intermetallic or bimetallic alloy nanoparticles may be obtained alone or it is difficult to obtain particles having a desired element ratio. In addition, when the amount of the reducing agent exceeds 20 times that of the salts, it is not easy to remove the reducing agent and by-products in the purifying process.

In a specific embodiment, the second solution may further include a capping agent.

The capping agent is added during the solution process and adjusts the size and shape of metal nanoparticles. In addition, the capping agent includes an element such as N, O, S, or the like and thus is readily bound to surfaces of metal particles by lone pair electrons of atoms of the element to cover the surfaces thereof and, accordingly, oxidation of the metal nanoparticles may be prevented.

The capping agent is not particularly limited and may, for example, be at least one selected from the group consisting of sodium L-tartrate dibasic dehydrate, potassium sodium tartrate, sodium acrylate, poly(acrylic acid sodium salt), sodium citrate, trisodium citrate, disodium citrate, sodium gluconate, sodium ascorbate, sorbitol, triethyl phosphate, ethylene diamine, propylene diamine, 1,2-ethanedithiol, and ethanethiol.

In a specific embodiment, the amount of the capping agent may, for example, be greater than 0 moles to 20 moles based on 1 mole of the metal salts in the mixture of the first and second solutions.

When the amount of the capping agent is greater than 20 times with respect to 1 mole of the metal salts, it is difficult to purify the metal nanoparticles and purity of the metal nanoparticles may be deteriorated.

In the preparing of the mixture, when adding the second solution to the first solution, the mixture may be stirred while slowly adding the second solution dropwise, thereby obtaining alloy-type metal nanoparticles having uniform composition and particle size. In this regard, the alloy-type metal nanoparticles may have a size of about 1 nm to about 1000 nm.

The metal nanoparticles obtained through synthesizing and purifying processes may be bimetallic or intermetallic alloy-type nanoparticles and may be one kind of metal nanoparticles or a mixture of at least two kinds of metal nanoparticles according to reaction conditions.

The inventors of the present invention confirmed that the bimetallic or intermetallic alloy type metal nanoparticles prepared using the preparation method according to the present invention exhibit more vigorous particle growth than when compared to a case in which CZTS nanoparticles are used, may form a high-density film due to an increase in volume occurring by addition of a Group XVI element in the selenization process through heat treatment, and are relatively resistant to oxidation due to this structure and thus provide excellent film quality after heat treatment and selenization.

The present invention also provides metal nanoparticles prepared using the preparation method described above.

The prepared metal nanoparticles are not limited so long as they include at least two metals selected from the group consisting of Cu, Sn, and Zn. In particular, the metal nanoparticles may be at least one selected from the group consisting of Cu—Sn bimetallic metal nanoparticles, Cu—Zn bimetallic metal nanoparticles, Sn—Zn bimetallic metal nanoparticles, and Cu—Sn—Zn intermetallic metal nanoparticles. More particularly, the metal nanoparticles may be Cu—Sn bimetallic metal nanoparticles.

With regard to this, the present invention also provides an ink composition for preparing a light absorption layer, in which bimetallic or intermetallic metal nanoparticles including at least two metals selected from the group consisting of Cu, Zn, and Sn are dispersed in a solvent.

In this regard, examples of the bimetallic or intermetallic metal nanoparticles have already been described above. That is, in particular, the bimetallic or intermetallic metal nanoparticles may be at least one selected from the group consisting of Cu—Sn bimetallic metal nanoparticles, Cu—Zn bimetallic metal nanoparticles, Sn—Zn bimetallic metal nanoparticles, and Cu—Sn—Zn intermetallic metal nanoparticles, more particularly Cu—Sn bimetallic metal nanoparticles.

In addition, to achieve various technical purposes, in particular, to supplement deficient elements to form a CZTS thin film, to increase the density of a thin film through heat treatment by further adding S or Se, or to sufficiently include a Group XVI element in a film, the ink composition may further include S-containing nanoparticles and/or Se-containing nanoparticles other than the bimetallic or intermetallic metal nanoparticles.

In particular, bimetallic metal nanoparticles including only two kinds of metals need to be supplemented for deficient elements to form a CZTS thin film. In this regard, an ink composition may be prepared by adding a sulfide or selenide including a metal not present in the metal nanoparticles.

The S-containing nanoparticles or the Se-containing nanoparticles may be at least one compound selected from the group consisting of ZnS, SnS, $SnS_2$, CuS, $Cu_yS$ where $0.5 \leq y \leq 2.0$, ZnSe, SnSe, $SnSe_2$, CuSe, and $Cu_ySe$ where $0.5 \leq y \leq 2.0$. In particular, when Cu—Sn bimetallic metal nanoparticles are used, the S-containing nanoparticles or the Se-containing nanoparticles may be ZnS or ZnSe.

As described above, when the bimetallic or intermetallic metal nanoparticles are mixed with the S-containing nanoparticles and/or the Se-containing nanoparticles, a mix ratio thereof may be determined within a range within which composition of metals in the ink composition satisfies the following conditions: $0.5 \leq Cu/(Zn+Sn) \leq 1.5$ and $0.5 \leq Zn/Sn \leq 2$, in particular $0.7 \leq Cu/(Zn+Sn) \leq 1.2$ and $0.8 \leq Zn/Sn \leq 1.4$.

When the composition of metals is outside the above-described ranges, an undesired secondary phase or an undesired oxide may be formed, which cause reduction in efficiency of a thin film solar cell.

In addition, the present invention also provides a method of preparing a thin film including a light absorption layer by using the ink composition.

The method of preparing a thin film includes:

preparing an ink by dispersing, in a solvent, one kind of metal nanoparticles or a mixture of at least two kinds of metal nanoparticles that include at least two metals selected from the group consisting of Cu, Zn, and Sn;

coating the ink on a base provided with an electrode; and drying and heat-treating the ink coated on the base provided with an electrode.

In addition, the ink may be prepared by further dispersing, in the solvent, S-containing nanoparticles and/or Se-containing nanoparticles other than the metal nanoparticles or the mixture of at least two kinds of metal nanoparticles, as described above.

In this regard, examples of the metal nanoparticles, the S-containing nanoparticles, and the Se-containing nanoparticles and a mix ratio thereof have already been described above.

In a specific embodiment, the solvent used in preparation of the ink is not particularly limited so long as the solvent is a general organic solvent and may be one organic solvent selected from among alkanes, alkenes, alkynes, aromatics, ketones, nitriles, ethers, esters, organic halides, alcohols, amines, thiols, carboxylic acids, phosphines, phosphites, phosphates, sulfoxides, and amides or a mixture of at least one organic solvent selected therefrom.

In particular, the alcohols may be at least one mixed solvent selected from among ethanol, 1-propanol, 2-propanol, 1-pentanol, 2-pentanol, 1-hexanol, 2-hexanol, 3-hexanol, heptanol, octanol, ethylene glycol (EG), diethylene glycol monoethyl ether (DEGMEE), ethylene glycol monomethyl ether (EGMME), ethylene glycol monoethyl ether (EGMEE), ethylene glycol dimethyl ether (EGDME), ethylene glycol diethyl ether (EGDEE), ethylene glycol monopropyl ether (EGMPE), ethylene glycol monobutyl ether (EGMBE), 2-methyl-1-propanol, cyclopentanol, cyclohexanol, propylene glycol propyl ether (PGPE), diethylene glycol dimethyl ether (DEGDME), 1,2-propanediol (1,2-PD), 1,3-propanediol (1,3-PD), 1,4-butanediol (1,4-BD), 1,3-butanediol (1,3-BD), α-terpineol, diethylene glycol (DEG), glycerol, 2-(ethylamino)ethanol, 2-(methylamino)ethanol, and 2-amino-2-methyl-1-propanol.

The amines may be at least one mixed solvent selected from among triethyl amine, dibutyl amine, dipropyl amine, butylamine, ethanolamine, diethylenetriamine (DETA), triethylenetetramine (TETA), triethanolamine, 2-aminoethyl piperazine, 2-hydroxyethyl piperazine, dibutylamine, and tris(2-aminoethyl)amine.

The thiols may be at least one mixed solvent selected from among 1,2-ethanedithiol, pentanethiol, hexanethiol, and mercaptoethanol.

The alkanes may be at least one mixed solvent selected from among hexane, heptane, and octane.

The aromatics may be at least one mixed solvent selected from among toluene, xylene, nitrobenzene, and pyridine.

The organic halides may be at least one mixed solvent selected from among chloroform, methylene chloride, tetrachloromethane, dichloroethane, and chlorobenzene.

The nitriles may be acetonitrile.

The ketones may be at least one mixed solvent selected from among acetone, cyclohexanone, cyclopentanone, and acetyl acetone.

The ethers may be at least one mixed solvent selected from among ethyl ether, tetrahydrofuran, and 1,4-dioxane.

The sulfoxides may be at least one mixed solvent selected from among dimethyl sulfoxide (DMSO) and sulfolane.

The amides may be at least one mixed solvent selected from among dimethyl formamide (DMF) and n-methyl-2-pyrrolidone (NMP).

The esters may be at least one mixed solvent selected from among ethyl lactate, α-butyrolactone, and ethyl acetoacetate.

The carboxylic acids may be at least one mixed solvent selected from among propionic acid, hexanoic acid, meso-2,3-dimercaptosuccinic acid, thiolactic acid, and thioglycolic acid.

However, the solvents are only given as an example, and embodiments of the present invention are not limited thereto.

In some cases, in the preparing of the ink, the ink may be prepared by further adding an additive.

The additive may, for example, be at least one selected from the group consisting of a dispersant, a surfactant, a polymer, a binder, a crosslinking agent, an emulsifying agent, an anti-forming agent, a drying agent, a filler, a bulking agent, a thickening agent, a film conditioning agent, an antioxidant, a fluidizer, a leveling agent, and a corrosion inhibitor. In particular, the additive may be at least one selected from the group consisting of polyvinylpyrrolidone (PVP), polyvinylalcohol, Anti-terra 204, Anti-terra 205, ethyl cellulose, and DispersBYK110.

A method of forming a coating layer by coating the ink may, for example, be any one selected from the group consisting of wet coating, spray coating, spin-coating, doctor blade coating, contact printing, top feed reverse printing, bottom feed reverse printing, nozzle feed reverse printing, gravure printing, micro gravure printing, reverse micro gravure printing, roller coating, slot die coating, capillary coating, inkjet-printing, jet deposition, and spray deposition.

In addition, a selenization process may be performed to prepare the thin film of a solar cell. Selenization involves supplying a Group XVI element such as S or Se to the thin film to prepare a chalcogen compound formed of a metal and a Group XVI element. In this regard, the chalcogen compound has good optical bandgap values in the terrestrial solar spectrum and is thus a useful candidate material for photovoltaic applications.

The selenization process to supply S or Se may be performed using various methods.

As a first example, as described above, when the ink is prepared by dispersing, in the solvent, the metal nanoparticles or the mixture of at least two kinds of metal nanoparticles together with the S-containing nanoparticles and/or the Se-containing nanoparticles, effects obtained from the selenization process may be achieved through heat treatment. In addition, the ink may be prepared by further dispersing S and/or Se in the form of particles in the solvent.

As a second example, effects obtained from the selenization process may be achieved through heat treatment in the presence of S or Se.

In particular, S or Se may be present by supplying $H_2S$ or $H_2Se$ in a gaseous state or supplying Se or S in a gaseous state through heating.

As a third example, after the coating of the ink, S or Se may be stacked on the coated base, following by drying and heat-treating of the resulting base. In particular, the stacking process may be performed by a solution process or a deposition method.

FIG. 1 is a flowchart schematically illustrating a thin film preparation method according to an embodiment of the present invention.

The present invention also provides a thin film preparing using the above-described method.

The thin film may have a thickness of 0.5 μm to 3.0 μm, more particularly 0.5 μm to 2.5 μm.

When the thickness of the thin film is less than 0.5 μm, the density and amount of the light absorption layer are insufficient and thus desired photoelectric efficiency may not be obtained. On the other hand, when the thickness of the thin film exceeds 3.0 μm, movement distances of carriers increases and, accordingly, there is an increasing probability of recombination, which results in reduced efficiency.

The present invention also provides a thin film solar cell manufactured using the thin film.

A method of manufacturing a thin film solar cell is known in the art and thus a detailed description thereof will be omitted herein.

Effects of the Invention

As described above, a method of preparing metal nanoparticles according to the present invention may reduce manufacturing costs more than when compared to an existing vacuum process and is a safer than an existing solution process that uses toxic hydrazine.

In addition, when a thin film is prepared using the metal nanoparticles, the thin film is more resistant to oxidation than when compared to a case in which general metal particles are used, a light absorption layer having increased particle volume and thus higher density may be grown by adding a Group XVI element in a selenization process, and the Group XVI element may be sufficiently supplied to the inside of the thin film by mixing the metal nanoparticles with S-containing nanoparticles and/or Se-containing nanoparticles. Accordingly, a solar cell according to the present invention may have higher photoelectric efficiency as compared to a case in which existing CZTS nanoparticles are used.

BRIEF DESCRIPTION OF THE DRAWINGS

The above and other objects, features and other advantages of the present invention will be more clearly understood from the following detailed description taken in conjunction with the accompanying drawing, in which.

BEST MODE

Now, the present invention will be described in more detail with reference to the following examples. These examples are provided for illustration of the present invention only and should not be construed as limiting the scope and spirit of the present invention.

Example 1

Synthesis of Cu—Sn Particles

A mixed aqueous solution including 12 mmol of $CuCl_2$ and 10 mmol of $SnCl_2$ was slowly added dropwise to an aqueous solution including 60 mmol of $NaBH_4$, the resulting solution was stirred for 1 hour to induce reaction therebetween, and the formed particles were purified by centrifugation to prepare $Cu_6Sn_5$ bimetallic nanoparticles.

Example 2

Synthesis of Cu—Sn Particles

A mixed aqueous solution including 10 mmol of $CuCl_2$ and 10 mmol of $SnCl_2$ was slowly added dropwise to an aqueous solution including 100 mmol of $NaBH_4$, the resulting solution was stirred for 10 hours to induce reaction therebetween, and the formed particles were purified by centrifugation to prepare $Cu_6Sn_5$ bimetallic nanoparticles.

Example 3

Synthesis of Cu—Sn Particles

Figure 1:
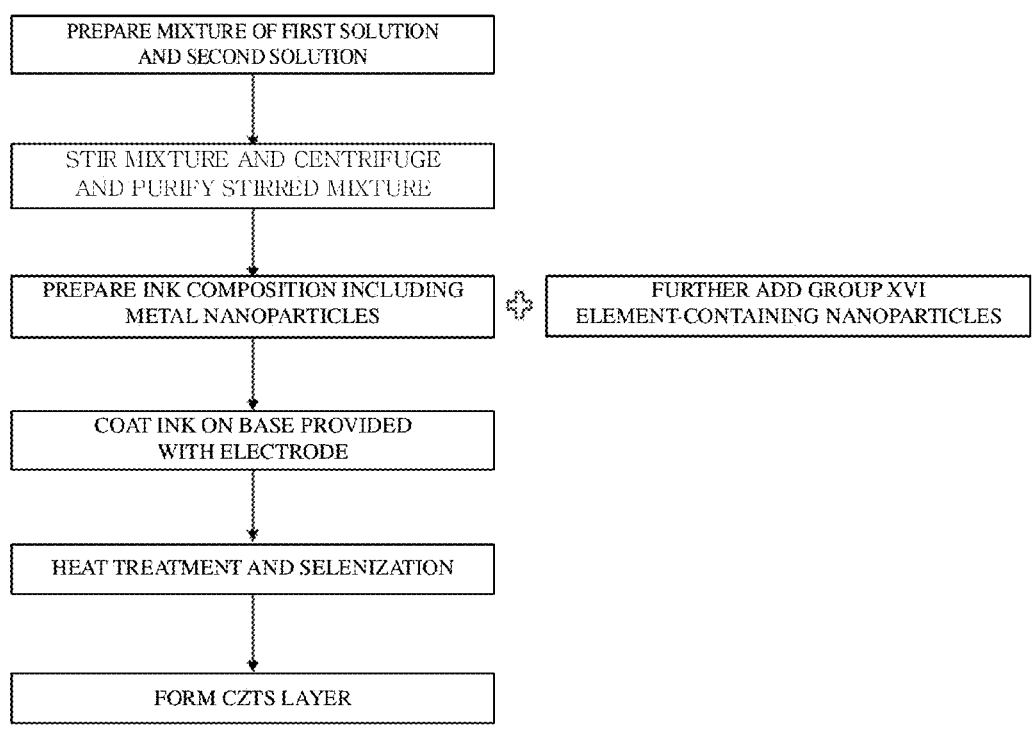
FIG. 1 is a flowchart schematically illustrating a thin film preparation method according to an embodiment of the present invention.
Figure 2:
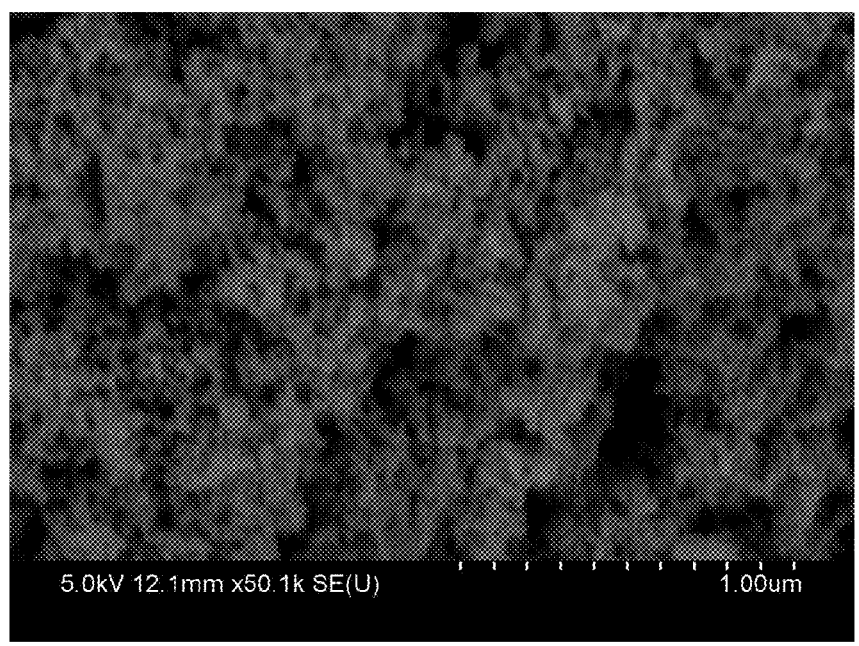
FIG. 2 is a scanning electron microscope (SEM) image of $Cu_6Sn_5$ bimetallic nanoparticles formed according to Example 3.
Figure 3:
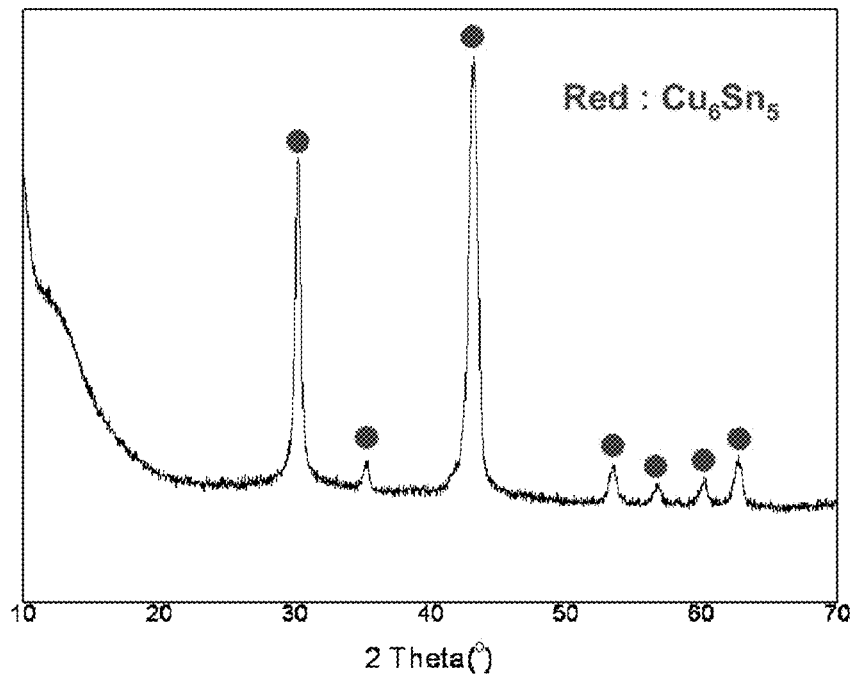
FIG. 3 is an X-ray diffraction (XRD) graph showing the $Cu_6Sn_5$ bimetallic nanoparticles of Example 3.

A mixed aqueous solution including 12 mmol of $CuCl_2$, 10 mmol of $SnCl_2$, and 50 mmol of trisodium citrate was added dropwise over 1 hour to an aqueous solution including 60 mmol of $NaBH_4$, the resulting solution was stirred for 24 hours to induce reaction therebetween, and the formed particles were purified by centrifugation to prepare $Cu_6Sn_5$ bimetallic nanoparticles. An SEM image and XRD graph of the $Cu_6Sn_5$ bimetallic nanoparticles are illustrated in FIGS. 2 and 3, respectively.

Example 4

Synthesis of Cu—Sn Particles

A mixed aqueous solution including 10 mmol of $CuCl_2$ and 10 mmol of $SnCl_2$ was slowly added dropwise to an aqueous solution including 150 mmol of $NaBH_4$, the resulting solution was stirred for 24 hours to induce reaction therebetween, and the formed particles were purified by centrifugation to prepare $Cu_6Sn_5$ bimetallic nanoparticles.

Example 5

Synthesis of Cu—Sn Particles

A mixed aqueous solution including 12 mmol of $CuCl_2$ and 10 mmol of $SnCl_2$ was slowly added dropwise to an aqueous solution including 150 mmol of $NaBH_4$, the resulting solution was stirred for 24 hours to induce reaction therebetween, and the formed particles were purified by centrifugation to prepare $Cu_6Sn_5$ bimetallic nanoparticles.

Example 6

Synthesis of Cu—Sn Particles

A diethylene glycol (DEG) mixed solution including 10 mmol of $CuCl_2$ and 10 mmol of $SnCl_2$ was slowly added dropwise to a DEG mixed solution including 150 mmol of $NaBH_4$, the resulting solution was stirred for 1 hour to induce reaction therebetween, and the formed particles were purified by centrifugation to prepare $Cu_6Sn_5$ bimetallic nanoparticles.

Example 7

Synthesis of Cu—Sn Particles

A mixed solution including 9.5 mmol of $CuCl_2$, 5 mmol of $SnCl_2$, and 14.5 mmol of trisodium citrate was added dropwise over 45 minutes to an aqueous solution including 87 mmol of $NaBH_4$, the resulting solution was stirred for 1 hour to induce reaction therebetween, and the formed particles were purified by vacuum filtration and then vacuum-dried to prepare bimetallic particles having $Cu_6Sn_5$ and Cu-rich Cu—Sn phases.

Example 8

Synthesis of Cu—Sn Particles

A DMSO solution including 10 mmol of $CuCl_2$ and 5 mmol of $SnCl_2$ was slowly added dropwise to a DMSO solution including 90 mmol of $NaBH_4$ and the resulting solution was stirred for 24 hours to prepare Cu—Sn bimetallic particles having $Cu_6Sn_5$ and Cu-rich Cu—Sn phases.

Example 9

Synthesis of Cu—Zn Particles

A mixed aqueous solution including 10 mmol of $CuCl_2$ and 10 mmol of $ZnCl_2$ was slowly added dropwise to an aqueous solution including 120 mmol of $NaBH_4$, the resulting solution was stirred for 12 hours to induce reaction therebetween, and the formed particles were purified by centrifugation to prepare $Cu_5Zn_8$ bimetallic nanoparticles.

Example 10

Synthesis of Cu—Zn Particles

Figure 4:
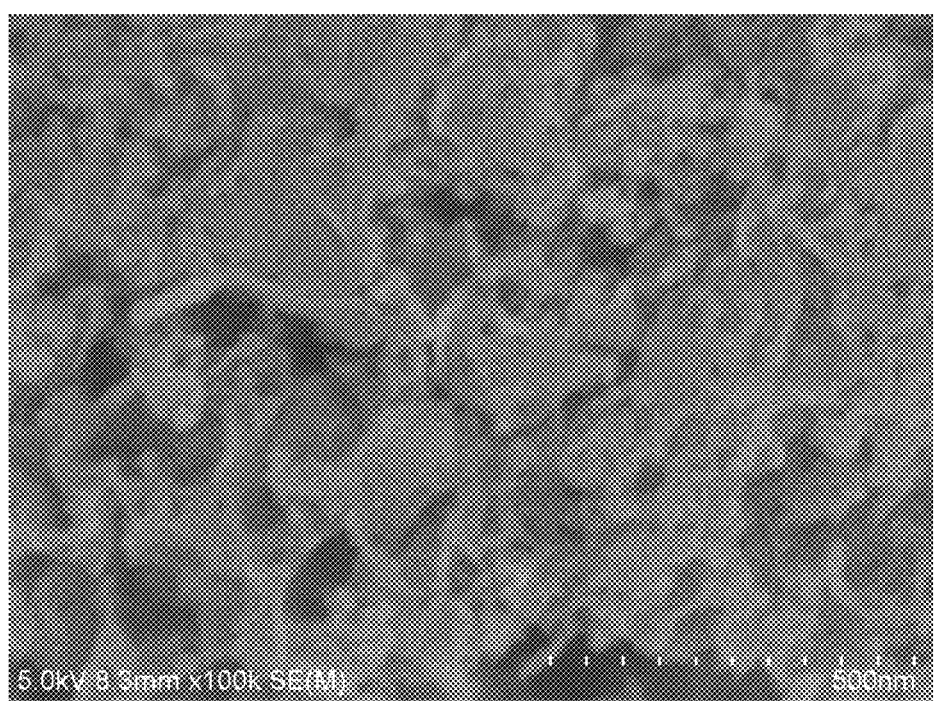
FIG. 4 is an SEM image of $Cu_5Zn_8$ nanoparticles formed according to Example 10.

A mixed aqueous solution including 10 mmol of $CuCl_2$ and 16 mmol of $ZnCl_2$ was slowly added dropwise to an aqueous solution including 60 mmol of $NaBH_4$, the resulting solution was stirred for 12 hours to induce reaction therebetween, and the formed particles were purified by centrifugation to prepare $Cu_5Zn_8$ bimetallic nanoparticles. Energy dispersive X-ray (EDX) microanalysis results of the $Cu_5Zn_8$ bimetallic nanoparticles are shown in Table 1 below and an SEM image of the $Cu_5Zn_8$ bimetallic nanoparticles is illustrated in FIG. 4.

TABLE 1

| Element | Atomic % | Atomic % | Atomic % |
|---------|----------|----------|----------|
| Cu K    | 40.20    | 38.56    | 39.57    |
| Zn K    | 59.80    | 61.44    | 60.43    |

Example 11

Synthesis of Cu—Zn Particles

A mixed aqueous solution including 10 mmol of $CuCl_2$, 10 mmol of $ZnCl_2$, and 40 mmol of sodium tartrate was slowly added dropwise to an aqueous solution including 100 mmol of $NaBH_4$, the resulting solution was stirred for 24 hours to induce reaction therebetween, and the formed particles were purified by centrifugation to prepare $Cu_5Zn_8$ bimetallic nanoparticles.

Example 12

Synthesis of Cu—Sn—Zn Particles

A mixed aqueous solution including 18 mmol of $CuCl_2$, 10 mmol of $SnCl_2$, and 12 mmol of $ZnCl_2$ was slowly added dropwise to an aqueous solution including 300 mmol of $NaBH_4$, the resulting solution was stirred for 24 hours to induce reaction therebetween, and the formed particles were purified by centrifugation to prepare $Cu_6Sn_5$ bimetallic nanoparticles and $Cu_5Zn_8$ bimetallic nanoparticles.

Example 13

Synthesis of Cu—Sn—Zn Particles

A mixed aqueous solution including 20 mmol of $CuCl_2$, 10 mmol of $SnCl_2$, and 12 mmol of $ZnCl_2$ was slowly added dropwise to an aqueous solution including 300 mmol of $NaBH_4$, the resulting solution was stirred for 24 hours to induce reaction therebetween, and the formed particles were purified by centrifugation to prepare $Cu_6Sn_5$ bimetallic nanoparticles and $Cu_5Zn_8$ bimetallic nanoparticles.

Example 14

Synthesis of Cu—Sn—Zn Particles

A DEG solution including 150 mmol of NaBH$_4$ was slowly added dropwise to a DEG solution including 19 mmol of CuCl$_2$, 10 mmol of SnCl$_2$, and 12 mmol of ZnCl$_2$, the resulting solution was stirred for 24 hours to induce reaction therebetween, and the formed particles were purified by centrifugation to prepare Cu$_6$Sn$_5$ bimetallic nanoparticles and Cu$_5$Zn$_8$ bimetallic nanoparticles.

Example 15

Synthesis of Cu—Sn—Zn Particles

Figure 5:
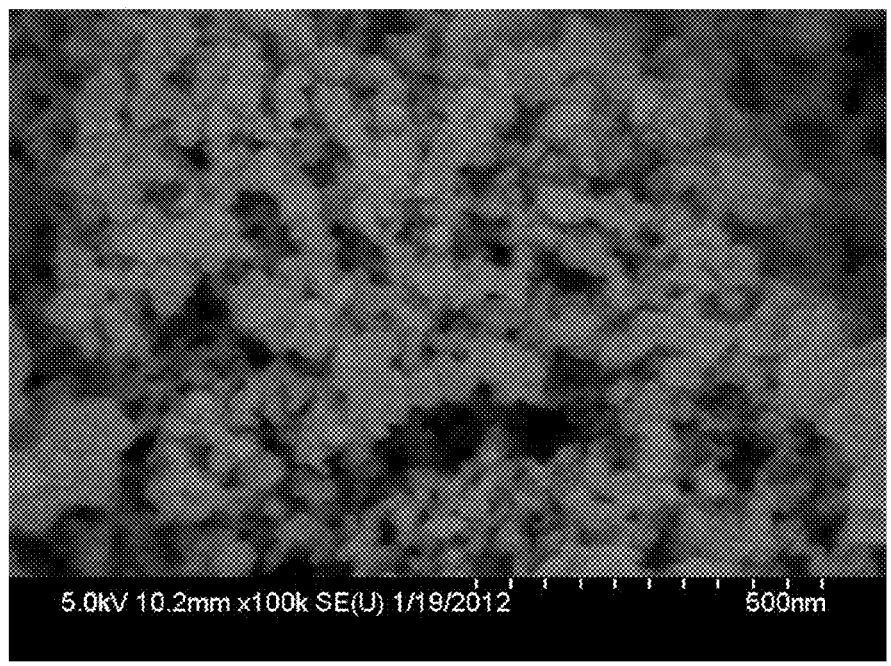
FIG. 5 is an SEM image of Cu—Sn—Zn intermetallic nanoparticles formed according to Example 15.
Figure 6:
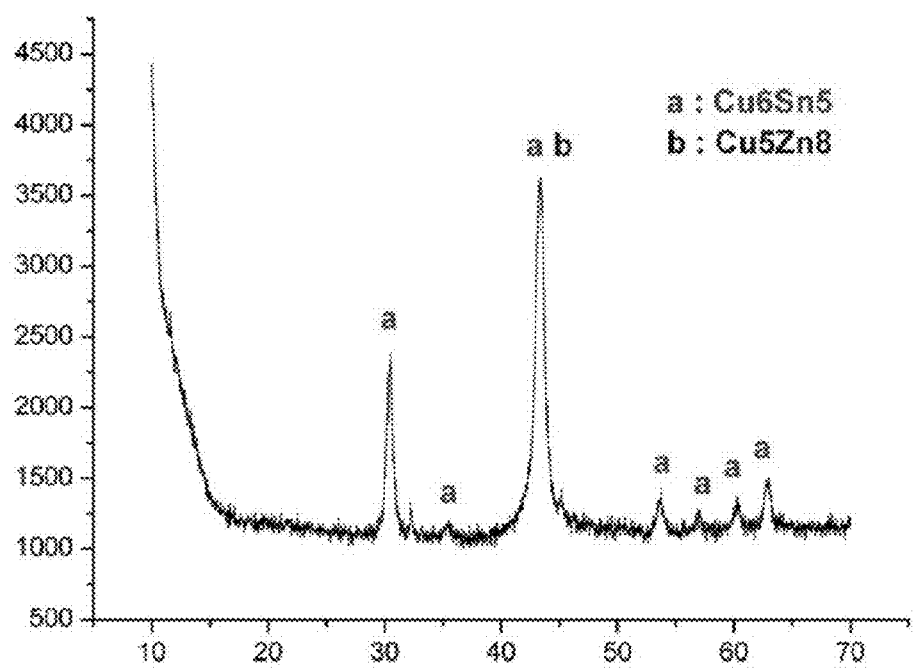
FIG. 6 is an XRD graph showing the Cu—Sn—Zn intermetallic nanoparticles of Example 15.

A mixed aqueous solution including 18 mmol of CuCl$_2$, 10 mmol of SnCl$_2$, 12 mmol of ZnCl$_2$, and 50 mmol of sodium tartrate was slowly added dropwise to an aqueous solution including 300 mmol of NaBH$_4$, the resulting solution was stirred for 24 hours to induce reaction therebetween, and the formed particles were purified by centrifugation to prepare Cu—Sn—Zn bimetallic nanoparticles. The Cu—Sn—Zn bimetallic nanoparticles exhibited Cu$_6$Sn$_5$ and Cu$_5$Zn$_8$ crystal phases and had composition ratios satisfying the following conditions: Cu/(Zn+Sn)=0.99 and Zn/Sn=1.21 as a result of inductively coupled plasma (ICP) analysis. An SEM image and XRD graph of the Cu—Sn—Zn bimetallic nanoparticles are illustrated in FIGS. 5 and 6, respectively.

Example 16

Synthesis of Cu—Sn—Zn Particles

Figure 7:
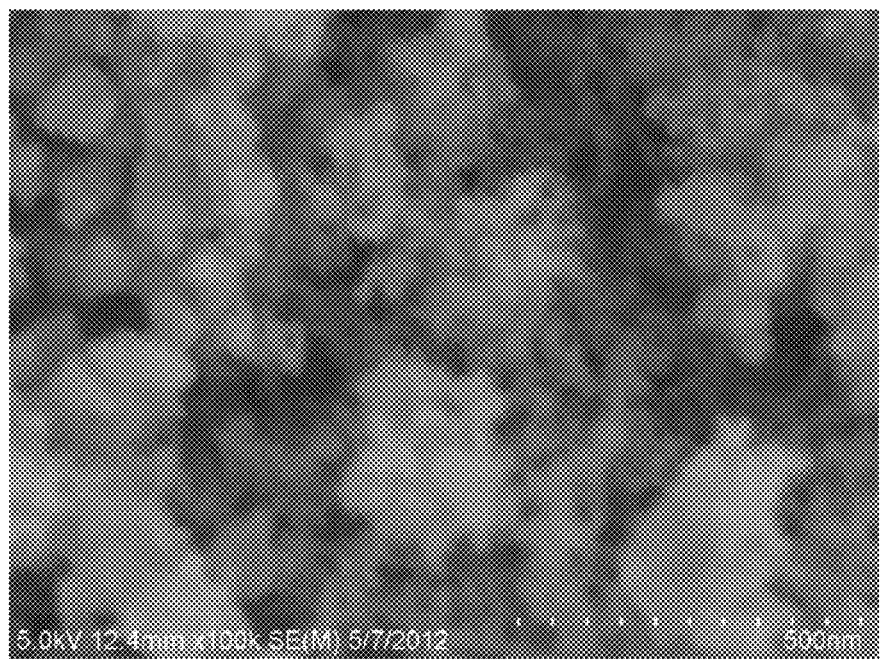
FIG. 7 is an SEM image of Cu—Sn—Zn intermetallic nanoparticles formed according to Example 16.
Figure 8:
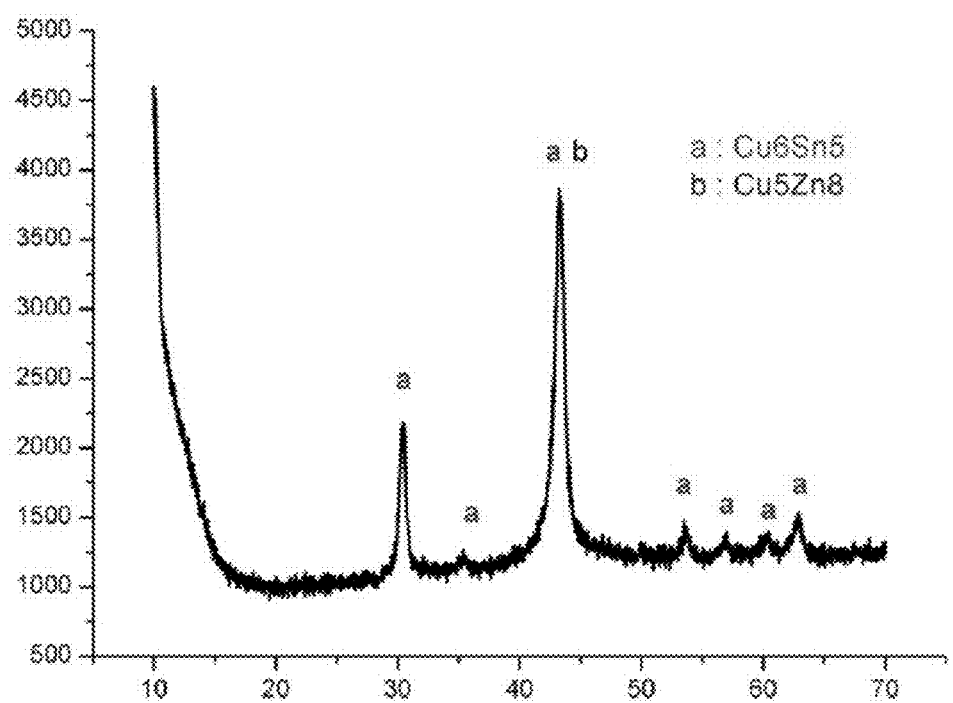
FIG. 8 is an XRD graph showing the Cu—Sn—Zn intermetallic nanoparticles of Example 16.

A mixed aqueous solution including 20 mmol of CuCl$_2$, 10 mmol of SnCl$_2$, 12 mmol of ZnCl$_2$, and 50 mmol of sodium tartrate was slowly added dropwise to an aqueous solution including 300 mmol of NaBH$_4$, the resulting solution was stirred for 24 hours to induce reaction therebetween, and the formed particles were purified by centrifugation to prepare Cu—Sn—Zn bimetallic nanoparticles. The Cu—Sn—Zn bimetallic nanoparticles exhibited Cu$_6$Sn$_5$ and Cu$_5$Zn$_8$ crystal phases and had composition ratios satisfying the following conditions: Cu/(Zn+Sn)=0.99 and Zn/Sn=1.21 as a result of ICP analysis. An SEM image and XRD graph of the Cu—Sn—Zn bimetallic nanoparticles are illustrated in FIGS. 7 and 8, respectively.

Comparative Example 1

Synthesis of CZTS Particles

Cupric acetylacetonate (Cu(acac)$_2$), zinc acetate (Zn(OAc)$_2$), SnCl$_2$.2 H$_2$O, and sulfur (S) were mixed in an oleylamine solution, the mixed solution was stirred under an inert atmosphere at 280° C. for 1 hour to induce reaction therebetween, and the prepared particles were purified by centrifugation to prepare CZTS nanoparticles.

Comparative Example 2

Synthesis of CZTS Particles

Cu(acac)$_2$, Zn(OAc)$_2$, and Sn(acac)$_2$Br$_2$ were dissolved in an oleylamine solution and the temperature thereof was raised to 225° C. Here, an oleylamine solution with S dissolved therein was further added dropwise to the resulting solution and the prepared particles were purified by centrifugation to prepare CZTS nanoparticles.

Example 17

Preparation of Thin Film

Figure 9:
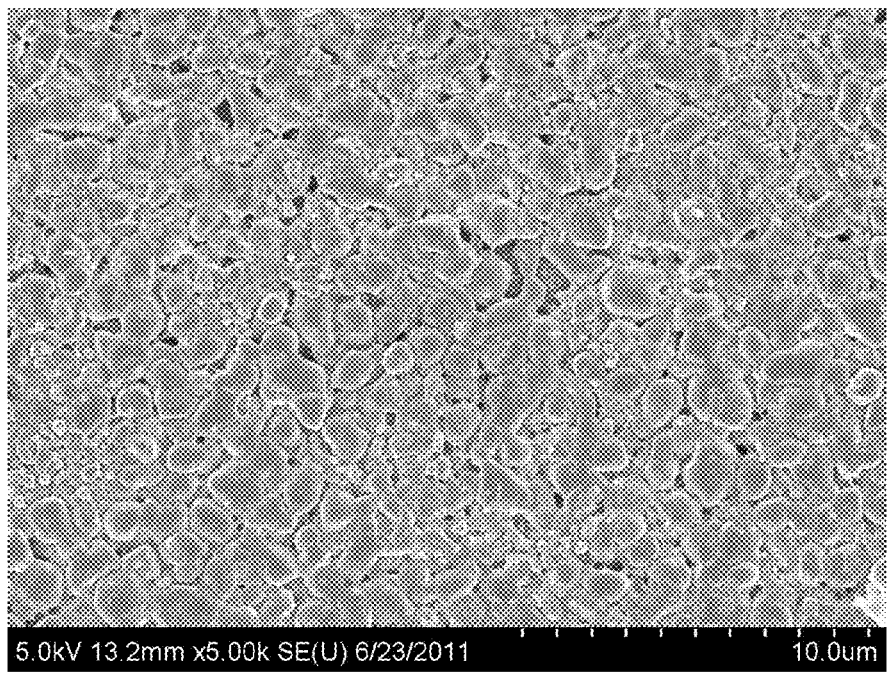
FIG. 9 is an SEM image showing a surface of a thin film prepared according to Example 17.
Figure 10:
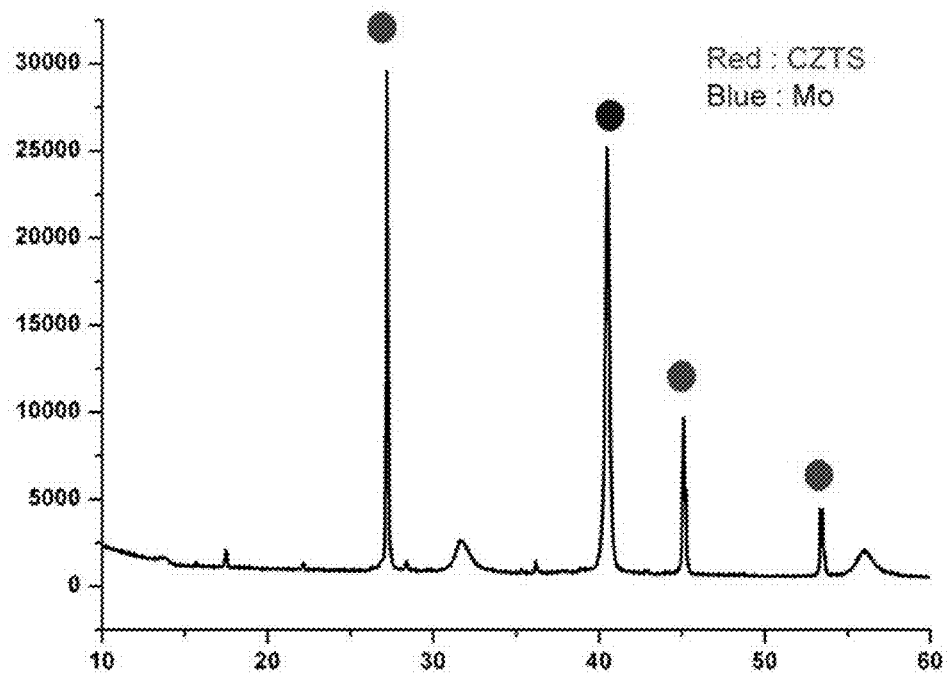
FIG. 10 is an XRD graph showing the thin film of Example 17.

The Cu—Sn particles prepared according to Example 3 were mixed with ZnS particles and CuSe particles and the mixed particles were dispersed in a mixture of alcohol-based solvents to prepare an ink. Subsequently, the ink was coated onto a glass substrate coated with molybdenum (Mo) to form a coating film. Thereafter, the coating film was dried and then subjected to rapid thermal annealing (RTA) at 550° C., thereby completing preparation of a CZTS-based thin film. An SEM image and XRD graph of the prepared thin film are illustrated in FIGS. 9 and 10, respectively.

Example 18

Preparation of Thin Film

Figure 11:
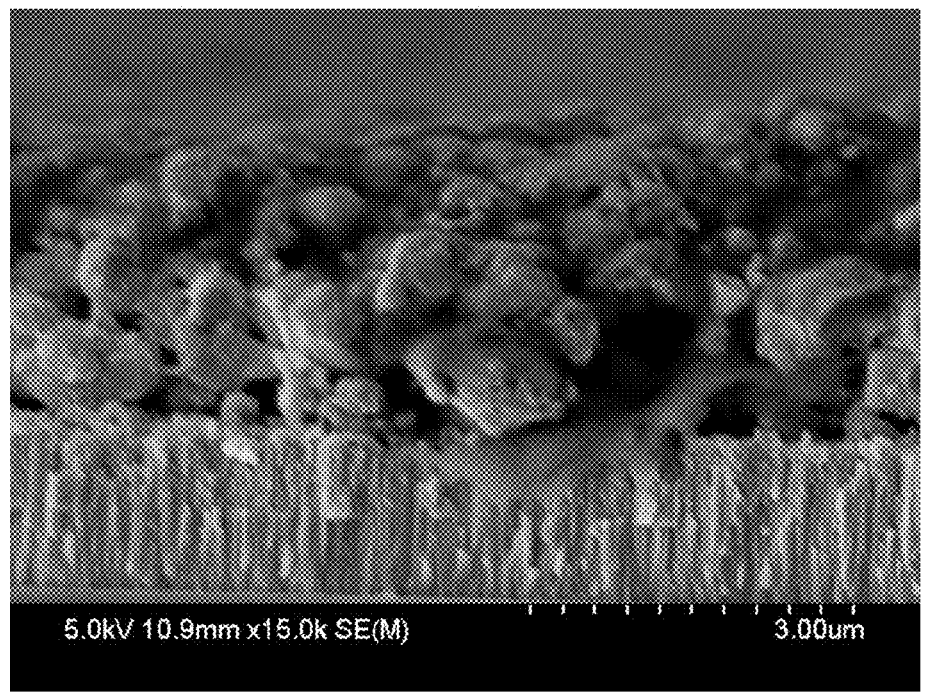
FIG. 11 is an SEM image showing a section of a thin film prepared according to Example 18.
Figure 12:
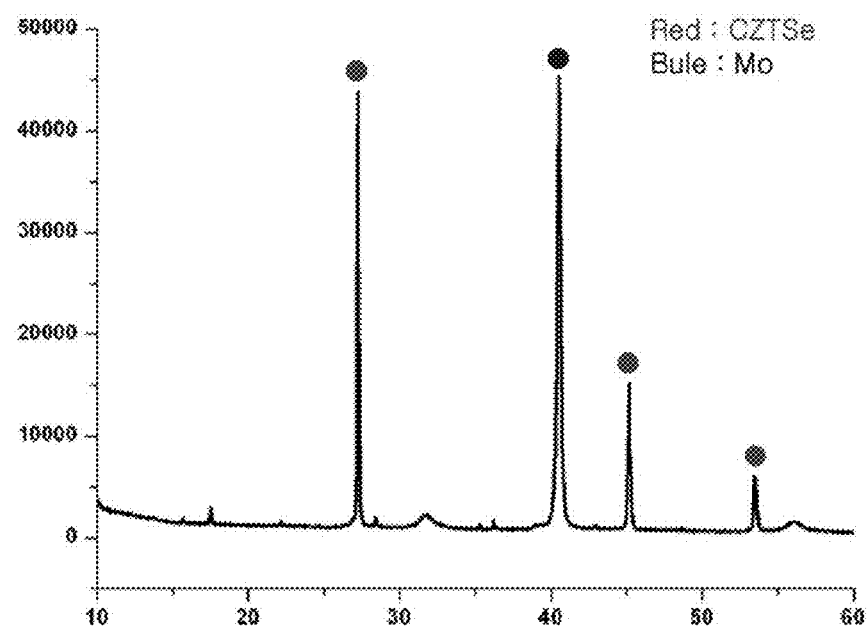
FIG. 12 is an XRD graph showing the thin film of Example 18.

The Cu—Zn—Sn particles prepared according to Example 15 were dispersed in a mixed solvent to prepare an ink, and the ink was coated onto a glass substrate coated with Mo to form a coating film. Subsequently, the coating film was dried, heated with the glass substrate deposited with Se so as to have a Se atmosphere, and then subjected to RTA at 550° C., thereby completing preparation of a CZTS-based thin film. An SEM image and XRD graph of the CZTS-based thin film are illustrated in FIGS. 11 and 12, respectively.

Example 19

Preparation of Thin Film

The Cu—Zn—Sn particles of Example 15 were dispersed in a mixed solvent to prepare an ink, and a glass substrate coated with Mo was coated with the ink to form a coating film. Subsequently, the coating film was dried, heated with the glass substrate deposited with S so as to have an S atmosphere, and then subjected to RTA at 550° C., thereby completing preparation of a CZTS-based thin film.

Example 20

Preparation of Thin Film

The Cu—Sn particles (Cu/Sn=2.05) prepared according to Example 7 were dispersed in a mixed solvent together with ZnS particles to prepare an ink, and a glass substrate coated with Mo was coated with the ink to form a coating film. Subsequently, the coating film was dried, heated together with the glass substrate deposited with S so as to have an S atmosphere, and then subjected to RTA at 550° C., thereby completing preparation of a CZTS-based thin film.

Comparative Example 3

Preparation of Thin Film

The CZTS particles prepared according to Comparative Example 1 were dispersed in toluene as a solvent to prepare an ink, and a glass substrate coated with Au was coated with the ink to form a coating film. Subsequently, the coating film was dried and not subjected to separate heat treatment, thereby completing preparation of a CZTS-based thin film.

Comparative Example 4

Preparation of Thin Film

The CZTS particles prepared according to Comparative Example 2 were dispersed in toluene as a solvent to prepare an ink, and the ink is coated onto a soda lime glass substrate coated with Mo to form a coating film. Subsequently, the coating film is dried and then subjected to heat treated at 450° C. in a Se atmosphere, thereby completing preparation of a CZTS-based thin film.

Example 21

Manufacture of Thin Film Solar Cell

Figure 13:
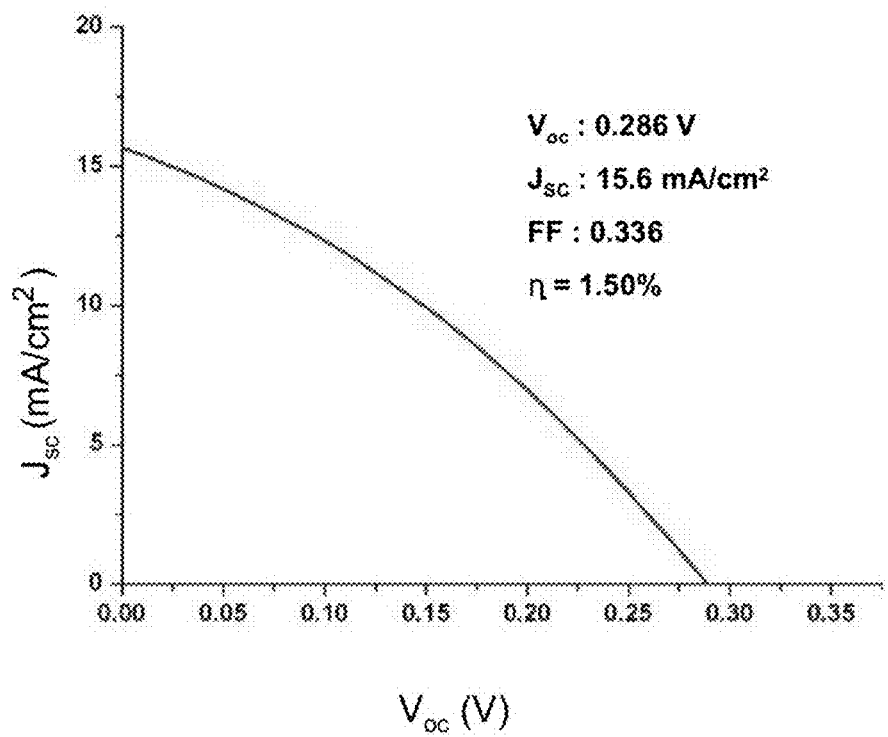
FIG. 13 is a graph showing current-voltage (IV) characteristics of a thin film solar cell manufactured according to Example 21.

The CZTS-based thin film prepared according to Example 17 was etched using a potassium cyanide (KCN) solution, a CdS layer having a thickness of 50 nm was mounted thereon by chemical bath deposition (CBD), and a ZnO layer having a thickness of 100 nm and an Al-doped ZnO layer having a thickness of 500 nm were sequentially stacked thereon by sputtering, thereby completing preparation of a thin film. Subsequently, an Al electrode was formed at the thin film, thereby completing manufacture of a thin film solar cell. A graph showing current-voltage (I-V) characteristics of the thin film solar cell is illustrated in FIG. 13.

Example 22

Manufacture of Thin Film Solar Cell

Figure 14:
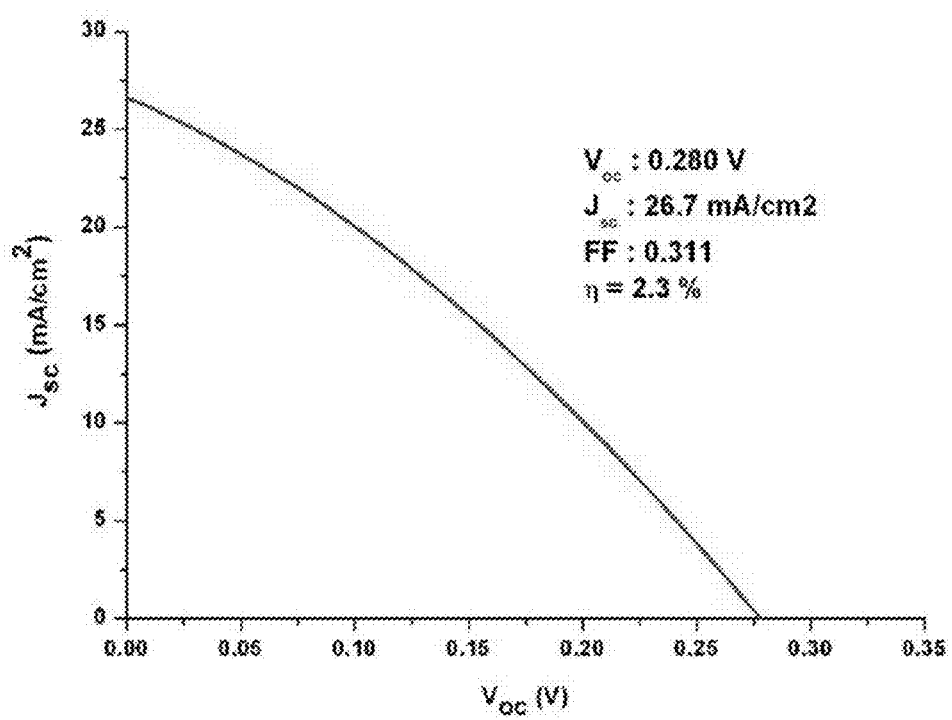
FIG. 14 is a graph showing IV characteristics of a thin film solar cell manufactured according to Example 22.

A thin film solar cell was manufactured in the same manner as in Example 21, except that the thin film prepared according to Example 18 was used. A graph showing I-V characteristics of the thin film solar cell is illustrated in FIG. 14.

Example 23

Manufacture of Thin Film Solar Cell

Figure 15:
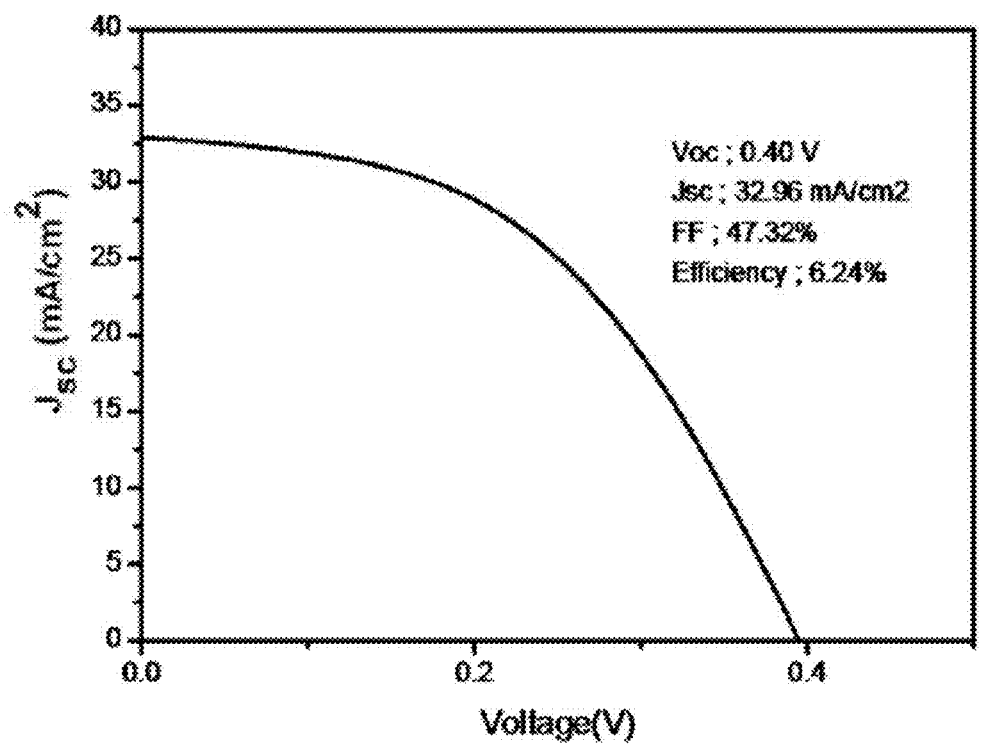
FIG. 15 is a graph showing IV characteristics of a thin film solar cell manufactured according to Example 23.

A thin film solar cell was manufactured in the same manner as in Example 21, except that the thin film prepared according to Example 20 was used. A graph showing I-V characteristics of the thin film solar cell is illustrated in FIG. 15.

Comparative Example 5

Manufacture of Thin Film Solar Cell

Figure 16:
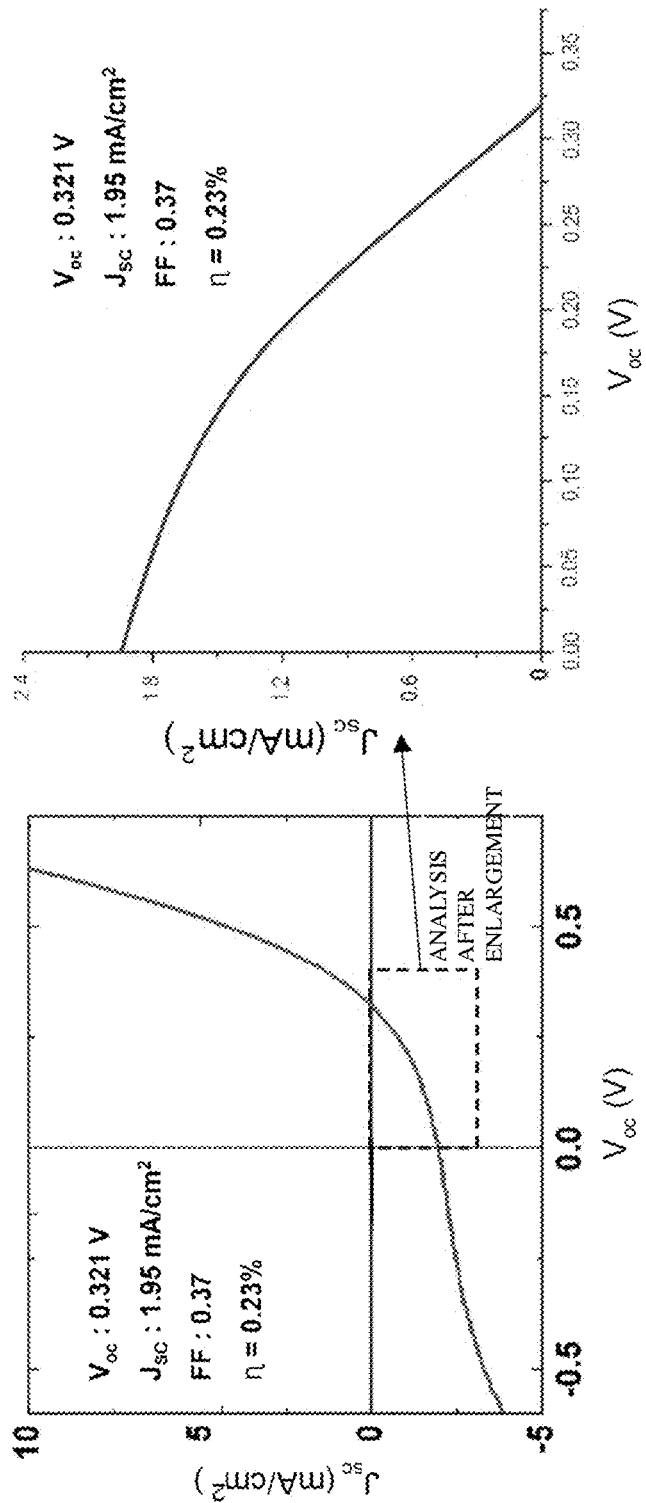
FIG. 16 is a graph showing IV characteristics of a thin film solar cell manufactured according to Comparative Example 5.

A CdS layer was mounted on the CZTS-based thin film prepared according to Comparative Example 3 by CBD, a ZnO layer and an ITO layer were sequentially stacked thereon by sputtering to prepare a thin film, and an electrode was formed at the thin film, thereby completing manufacture of a thin film solar cell. A graph showing I-V characteristics of the thin film solar cell is illustrated in FIG. 16.

Comparative Example 6

Manufacture of Thin Film Solar Cell

Figure 17:
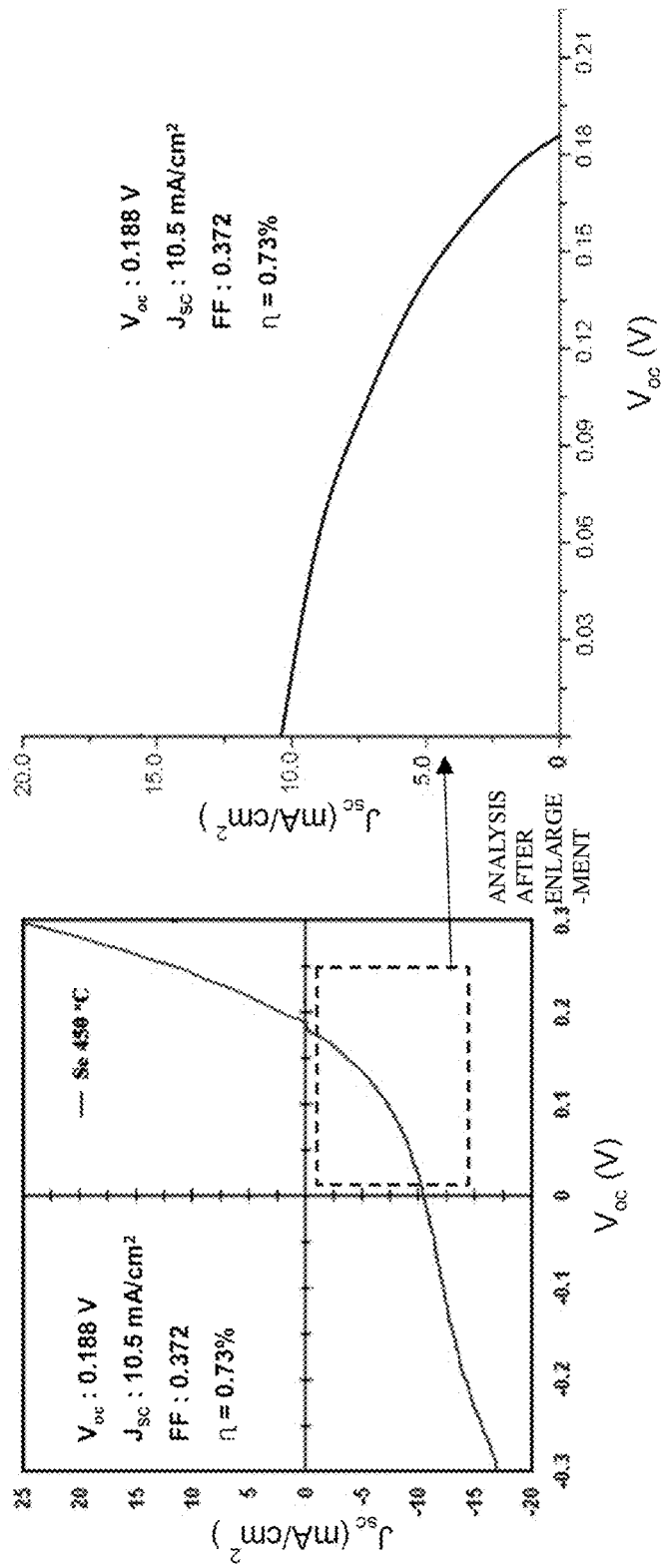
FIG. 17 is a graph showing IV characteristics of a thin film solar cell manufactured according to Comparative Example 6.

A CdS layer was mounted on the CZTS-based thin film prepared according to Comparative Example 4 by CBD, a ZnO layer and an ITO layer were sequentially stacked thereon by sputtering to prepare a thin film, and an electrode was formed at the thin film, thereby completing manufacture of a thin film solar cell. A graph showing I-V characteristics of the thin film solar cell is illustrated in FIG. 17.

Experimental Example 1

Photoelectric efficiencies of the thin film solar cells of Examples 21, 22 and 23 and Comparative Examples 5 and 6 were measured and measurement results are shown in Table 2 below and FIGS. 13 to 17.

TABLE 2

| | $J_{sc}$ (mA/cm$^2$) | $V_{oc}$ (V) | FF | Photoelectric efficiency (%) |
|---|---|---|---|---|
| Example 21 | 15.6 | 0.286 | 0.336 | 1.50 |
| Example 22 | 26.7 | 0.280 | 0.311 | 2.30 |
| Example 23 | 32.96 | 0.40 | 0.473 | 6.24 |
| Comparative Example 5 | 1.95 | 0.321 | 0.370 | 0.23 |
| Comparative Example 6 | 10.5 | 0.188 | 0.372 | 0.73 |

In Table 2, $J_{sc}$, which is a variable determining the efficiency of each solar cell, represents current density, $V_{oc}$ denotes an open circuit voltage measured at zero output current, the photoelectric efficiency means a rate of cell output according to irradiance of light incident upon a solar cell plate, and fill factor (FF) represents a value obtained by dividing a value obtained by multiplication of current density and voltage values at a maximum power point by a value obtained by multiplication of Voc by $J_{sc}$.

As seen in Table 2 above, the thin film solar cells of Examples 21, 22 and 23 have much higher photoelectric efficiency than that of the thin film solar cells of Comparative Examples 5 and 6. That is, the nanoparticles used in the thin film solar cells of Examples 21, 22 and 23 exhibit more vigorous growth and are in the form of bimetallic alloy-type particles and thus may exhibit oxidation stability in a heat treatment process and, accordingly, may provide higher film quality, which results in higher photoelectric efficiency than that of the solar cells of Comparative Examples 5 and 6.

In addition, each of the thin film solar cells of Examples 21 and 23 includes a thin film formed using an ink prepared by adding metal nanoparticles and S-containing nanoparticles and thus a Group XVI element is sufficiently included in the thin film and, in the solar cell of Example 22, density of the thin film is increased through volume expansion by addition of a Group XVI element in the heat treatment process of the thin film. Thus, the thin film solar cells of Examples 21, 22 and 23 have enhanced photoelectric efficiency.

Meanwhile, the thin film solar cell of Comparative Example 6 is manufactured by a method including heat treatment in a Se atmosphere as a subsequent process as in the thin film preparation method according to the present invention and thus exhibits higher photoelectric efficiency than that of the thin film solar cell of Comparative Example 5 manufactured without a heat treatment process. However, the thin film solar cells of Comparative Examples 5 and 6 have much lower photoelectric efficiency than that of the thin film solar cells of Examples 21, 22 and 23 having excellent film quality by use of bimetallic nanoparticles.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:
1. A method of preparing metal nanoparticles for forming a light absorption layer of a solar cell, the method comprising:
    preparing a first solution comprising a reducing agent;
    preparing a second solution comprising at least two salts selected from the group consisting of a copper (Cu) salt, a zinc (Zn) salt, and a tin (Sn) salt;

preparing a mixture by adding dropwise the second solution to the first solution; and synthesizing at least one kind of metal nanoparticles by reaction of the mixture and purifying the synthesized metal nanoparticles, wherein the metal nanoparticles are at least one selected from the group consisting of Cu-Sn bimetallic metal nanoparticles, Cu—Zn bimetallic metal nanoparticles, Sn—Zn bimetallic nanoparticles, and Cu—Sn—Zn intermetallic metal nanoparticles.

2. The method according to claim 1, wherein the reducing agent is an organic reducing agent and/or an inorganic reducing agent.

3. The method according to claim 1, wherein the reducing agent is one selected from the group consisting of $LiBH_4$, $NaBH_4$, $KBH_4$, $Ca(BH_4)_2$, $Mg(BH_4)_2$, $LiB(Et)_3H_2$, $NaBH_3(CN)$, $NaBH(OAc)_3$, ascorbic acid, and triethanolamine.

4. The method according to claim 1, wherein a solvent of each of the first and second solutions is at least one selected from the group consisting of water, diethylene glycol, methanol, oleylamine, ethyleneglycol, triethylene glycol, dimethyl sulfoxide, dimethyl formamide, and N-methyl-2-pyrrolidone (NMP).

5. The method according to claim 1, wherein the salt is at least one selected from the group consisting of a chloride, a bromide, an iodide, a nitrate, a nitrite, a sulfate, an acetate, a sulfite, an acetylacetoante and a hydroxide.

6. The method according to claim 1, wherein the second solution further comprises a capping agent.

7. The method according to claim 6, wherein the capping agent is at least one selected from the group consisting of sodium L-tartrate dibasic dehydrate, potassium sodium tartrate, sodium acrylate, poly(acrylic acid sodium salt), sodium citrate, trisodium citrate, disodium citrate, sodium gluconate, sodium ascorbate, sorbitol, triethyl phosphate, ethylene diamine, propylene diamine, 1,2-ethanedithiol, and ethanethiol.

8. The method according to claim 1, wherein a mix ratio of the salts to the reducing agent in the mixture is 1:1 to 1:20 on a molar ratio basis.

9. The method according to claim 6, wherein an amount of the capping agent in the second solution is greater than 0 moles to 20 moles based on 1 mole of the metal salts in the mixture of the first solution and the second solution.

10. The method according to claim 1, wherein the metal nanoparticles are prepared in the form of a bimetallic or intermetallic alloy.

11. Metal nanoparticles prepared using the method according to claim 1.

12. The metal nanoparticles according to claim 11, wherein the metal nanoparticles are Cu—Sn bimetallic metal nanoparticles.

13. An ink composition for preparing a light absorption layer, in which bimetallic or intermetallic metal nanoparticles are dispersed in a solvent, and wherein the bimetallic or intermetallic metal nanoparticles are at least one selected from the group consisting of Cu—Sn bimetallic metal nanoparticles, Cu—Zn bimetallic metal nanoparticles, Sn—Zn bimetallic nanoparticles, and Cu—Sn—Zn intermetallic metal nanoparticles, and wherein the method for preparing the bimetallic or intermetallic metal nanoparticles comprises:
preparing a first solution comprising a reducing agent;
preparing a second solution comprising at least two salts selected from the group consisting of a copper (Cu) salt, a zinc (Zn) salt, and a tin (Sn) salt;
preparing a mixture by adding dropwise the second solution to the first solution; and
synthesizing at least one kind of bimetallic or intermetallic metal nanoparticles by reaction of the mixture and purifying the synthesized metal nanoparticles.

14. The ink composition according to claim 13, wherein the ink composition further comprises sulfur (S)-containing nanoparticles and/or selenium (Se)-containing nanoparticles other than the bimetallic or intermetallic metal nanoparticles.

15. The ink composition according to claim 13, wherein the bimetallic or intermetallic metal nanoparticles are Cu—Sn bimetallic metal nanoparticles.

16. The ink composition according to claim 14, wherein the S-containing nanoparticles or the Se-containing nanoparticles are at least one compound selected from the group consisting of ZnS, SnS, $SnS_2$, CuS, $Cu_yS$ where $0.5 \leq y \leq 2.0$, ZnSe, SnSe, $SnSe_2$, CuSe, and $Cu_ySe$ where $0.5 \leq y \leq 2.0$.

17. The ink composition according to claim 14, wherein a mix ratio of the bimetallic or intermetallic metal nanoparticles to the S-containing nanoparticles and/or the Se-containing nanoparticles is determined within a range within which composition of metals in the ink composition satisfies the following conditions: $0.5 \leq Cu/(Zn+Sn) \leq 1.5$ and $0.5 \leq Zn/Sn \leq 2$.

18. A method of preparing a thin film including a light absorption layer by using the ink composition according to claim 13, the method comprising:
coating the ink composition on a base provided with an electrode; and
drying and heat-treating the ink composition coated on the base provided with an electrode.

19. The method according to claim 18, wherein the preparing further comprises preparing the ink composition by dispersing, in the solvent, S-containing nanoparticles and/or Se-containing nanoparticles together with the one kind of metal nanoparticles or the mixture of at least two kinds of metal nanoparticles.

20. The method according to claim 18, wherein the metal nanoparticles are Cu—Sn bimetallic metal nanoparticles.

21. The method according to claim 19, wherein the S-containing nanoparticles or the Se-containing nanoparticles are at least one compound selected from the group consisting of ZnS, SnS, $SnS_2$, CuS, $Cu_yS$ where $0.5 \leq y \leq 2.0$, ZnSe, SnSe, $SnSe_2$, CuSe, and $Cu_ySe$ where $0.5 \leq y \leq 2.0$.

22. The method according to claim 19, wherein a mix ratio of the metal nanoparticles to the S-containing nanoparticles and/or the Se-containing nanoparticles is determined within a range within which composition of metals in the ink satisfies the following conditions: $0.5 \leq Cu/(Zn+Sn) \leq 1.5$ and $0.5 \leq Zn/Sn \leq 2$.

23. The method according to claim 18, wherein the solvent for the preparing is at least one organic solvent selected from the group consisting of alkanes, alkenes, alkynes, aromatics, ketones, nitriles, ethers, esters, organic halides, alcohols, amines, thiols, carboxylic acids, phosphines, phosphates, sulfoxides, and amides.

24. The method according to claim 18, wherein the preparing further comprises adding an additive to the ink composition.

25. The method according to claim 24, wherein the additive is at least one selected from the group consisting of polyvinylpyrrolidone (PVP), polyvinylalcohol, Anti-terra 204, Anti-terra 205, ethyl cellulose, and DispersBYK110.

26. The method according to claim 18, wherein the heat-treating is performed in the presence of S or Se.

27. The method according to claim 26, wherein the presence of S or Se is obtained by supplying $H_2S$ or $H_2Se$ in a gaseous state or supplying Se or S in a gaseous state through heating.

28. The method according to claim 18, wherein the heat-treating is performed at a temperature of 400° C. to 900° C.

29. The method according to claim 18, further comprising stacking S or Se after the coating.

* * * * *